United States Patent
Du et al.

(10) Patent No.: US 10,084,109 B1
(45) Date of Patent: Sep. 25, 2018

(54) SEMICONDUCTOR STRUCTURE FOR IMPROVING THE GATE ADHESION AND SCHOTTKY STABILITY

(71) Applicant: WIN Semiconductors Corp., Tao Yuan (TW)

(72) Inventors: Jhih-Han Du, Tao Yuan (TW); Yi Wei Lien, Tao Yuan (TW); Che-Kai Lin, Tao Yuan (TW); Wei-Chou Wang, Tao Yuan (TW)

(73) Assignee: WIN SEMICONDUCTORS CORP., Tao Yuan (TW)

( * ) Notice: Subject to any disclaimer, the term of this patent is extended or adjusted under 35 U.S.C. 154(b) by 0 days.

(21) Appl. No.: 15/837,673

(22) Filed: Dec. 11, 2017

(51) Int. Cl.
| | |
|---|---|
| *H01L 29/80* | (2006.01) |
| *H01L 29/78* | (2006.01) |
| *H01L 27/06* | (2006.01) |
| *H01L 33/00* | (2010.01) |
| *H01L 33/32* | (2010.01) |
| *H01L 29/20* | (2006.01) |
| *H01L 29/47* | (2006.01) |
| *H01L 21/02* | (2006.01) |
| *H01L 21/285* | (2006.01) |

(52) U.S. Cl.
CPC ...... *H01L 33/0075* (2013.01); *H01L 21/0254* (2013.01); *H01L 21/28581* (2013.01); *H01L 29/2003* (2013.01); *H01L 29/475* (2013.01); *H01L 33/0025* (2013.01); *H01L 33/32* (2013.01)

(58) Field of Classification Search
CPC . H01L 33/0075; H01L 33/0025; H01L 33/32; H01L 21/0254; H01L 21/28581; H01L 29/475; H01L 29/2003

USPC ....... 257/11, 76, 77, 92, 194, 195, 256, 284, 257/342, E27.006, E27.014, E27.016, 257/E21.441, E21.615, E29.082, E29.089; 438/172, 182, 285, 574, 579
See application file for complete search history.

(56) References Cited

U.S. PATENT DOCUMENTS

| | | | | |
|---|---|---|---|---|
| 6,255,679 | B1 * | 7/2001 | Akiba | H01L 29/66871 257/280 |
| 6,268,632 | B1 * | 7/2001 | Sugimura | H01L 29/41758 257/365 |
| 8,901,653 | B2 * | 12/2014 | Hashimoto | H01L 29/41758 257/342 |
| 9,818,856 | B2 * | 11/2017 | Hoshi | H01L 29/7787 |

(Continued)

*Primary Examiner* — Dao H Nguyen
(74) *Attorney, Agent, or Firm* — Muncy, Geissler, Olds & Lowe, P.C.

(57) ABSTRACT

A semiconductor structure for improving the gate metal adhesion and the Schottky stability, comprising: a III-nitride semiconductor having a top surface on which a conductive area and a non-conductive area are defined; a source contact metal and a first drain contact metal forming ohmic contact with the III-nitride semiconductor on the conductive area, and the first drain contact metal provided at one side of the source contact metal; and a gate metal layer comprising a gate connection line and a first gate finger extending from the gate connection line, the first gate finger interposing between the source contact metal and the first drain contact metal and forming a Schottky contact with the III-nitride semiconductor on the conductive area, wherein the first gate finger has a first terminal anchor at an end thereof surrounding the source contact metal, and the first terminal anchor has an increased width.

13 Claims, 2 Drawing Sheets

(56) References Cited

U.S. PATENT DOCUMENTS

| | | | | |
|---|---|---|---|---|
| 2007/0228424 A1* | 10/2007 | Igarashi | .............. | H01L 27/0207 257/256 |
| 2011/0284928 A1* | 11/2011 | Shibata | ............... | H01L 27/0605 257/195 |
| 2014/0103360 A1* | 4/2014 | Hikita | ............... | H01L 29/66212 257/76 |

* cited by examiner

SEMICONDUCTOR STRUCTURE FOR IMPROVING THE GATE ADHESION AND SCHOTTKY STABILITY

FIELD OF THE INVENTION

The present invention relates to a semiconductor structure, and more particularly to a semiconductor structure made essentially of III-nitride semiconductor.

BACKGROUND OF THE INVENTION

The III-nitride semiconductor materials are known for their wide band gap property. For example, the GaN has the band gap of 3.4 eV, and the AlN has the band gap over 6.0 eV. This property is advantageous for the application in high-power and high-frequency MMIC (Monolithic Microwave Integrated Circuit), such as a high-power switch or a microwave power amplifier. A III-nitride semiconductor MMIC may include plural III-nitride semiconductor FETs. In a common layout, the gate contact layer of the plural III-nitride semiconductor FETs are formed in a comb-shape with plural gate contact fingers on a conductive area of the III-nitride semiconductor and a gate connection line connecting all gate contact fingers on the non-conductive area. The gate connection line is further connected to a gate contact pad through connection metal lines for input control voltage to the gate electrodes.

In a conventional III-nitride MMIC, the gate contact fingers form Schottky contact with the III-nitride semiconductor on the conductive area, and the gate anchor is formed on the non-conductive area or on the dielectric with a small piece metal. However, in the conventional III-nitride MMIC, the stability has a large variation, especially under high voltage and high temperature operation. The device performance at high temperature and high voltage is also related to the quality of gate adhesion to the semiconductor. When the quality of the gate adhesion to the semiconductor is poor, the end of the gate contact finger may peel off at high temperature and high voltage which decreases the Schottky stability of the device and leads to a degraded device performance. To achieve a better high temperature and high voltage application, the Schottky stability and gate adhesion of the III-nitride MMIC should be improved.

SUMMARY OF THE INVENTION

Accordingly, in order to solve the foregoing problem, the present invention provides a III-nitride semiconductor structure, which can effectively improve the Schottky stability, and gate adhesion at high temperature operation by engineering the stress in a III-nitride semiconductor.

To reach the objects stated above, the present invention provides a semiconductor structure for improving the gate metal adhesion and the Schottky stability, comprising a III-nitride semiconductor, a source contact metal, a first drain contact metal, and a gate metal layer. The III-nitride semiconductor has a top surface on which a conductive area and a non-conductive area are defined. The source contact metal forms an ohmic contact with the III-nitride semiconductor on the conductive area. The first drain contact metal is provided at one side of the source contact metal and forms an ohmic contact with the III-nitride semiconductor on the conductive area. The gate metal layer comprises a gate connection line and a first gate finger extending from the gate connection line. The first gate finger interposes between the source contact metal and the first drain contact metal and forms a Schottky contact with the III-nitride semiconductor on the conductive area, and the gate connection line is formed on the non-conductive area. The first gate finger has a first terminal anchor at an end thereof surrounding the source contact metal, and the first terminal anchor has an increased width.

In implementation, the source contact metal has a width, and the first terminal anchor surrounds the source contact metal in a range of 10% to 90% of the width of the source contact metal.

In implementation, the width of the first terminal anchor is ranging from 1 to 10 μm.

In implementation, the first terminal anchor is spaced from the source contact metal in a range of 2 to 10 μm.

In implementation, the semiconductor structure further comprises a second drain contact metal provided at another side of the source contact metal and forming an ohmic contact with the III-nitride semiconductor on the conductive area, in which the gate metal layer further comprises a second gate finger extending from the gate connection line and interposing between the source contact metal and the second drain contact metal and forming a Schottky contact with the III-nitride semiconductor on the conductive area The second gate finger has a second terminal anchor at an end thereof surrounding the source contact metal, and the second terminal anchor has an increased width.

In implementation, the first terminal anchor and the second terminal anchor are disconnected. The first terminal anchor and the second terminal anchor surround the source contact metal in a range of 10% to 90% of the width of the source contact metal.

In implementation, the first terminal anchor and the second terminal anchor are connected with each other.

In implementation, the width of the second terminal anchor is ranging from 1 to 10 μm.

In implementation, the second terminal anchor is spaced from the source contact metal in a range of 2 to 10 μm.

In implementation, the gate connection line is in direct contact with the III-nitride semiconductor on the non-conductive area.

In implementation, the semiconductor structure is a part of an FET.

In implementation, the semiconductor structure is a part of an MMIC.

The present invention will be understood more fully by reference to the detailed description of the drawings and the preferred embodiments below.

DETAILED DESCRIPTIONS OF PREFERRED EMBODIMENTS

Figure 1:
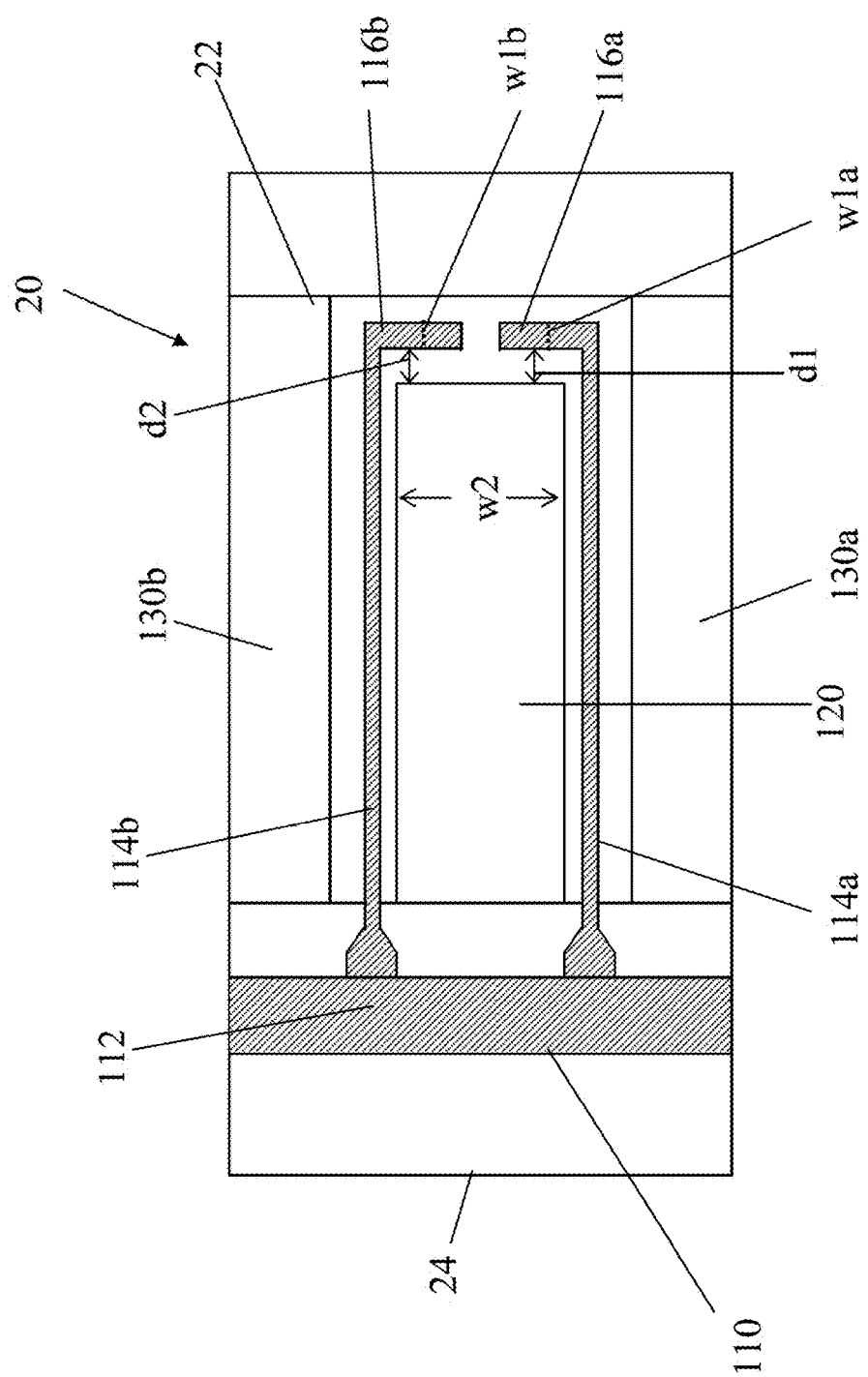
FIG. 1 is a schematic top view of an embodiment of the semiconductor structure provided by the present invention.

FIG. 1 is a schematic top view of an embodiment of a semiconductor structure provided by the present invention, which comprises: a III-nitride semiconductor 20, a source contact metal 120, a first drain contact metal 130a, and a gate metal layer 110. The III-nitride semiconductor 20 has a top surface on which a conductive area 22 and a non-conductive area 24 are defined. The source contact metal 120 forms an ohmic contact with the III-nitride semiconductor on the conductive area 22. The first drain contact metal 130a is provided at one side of the source contact metal 120 and forms an ohmic contact with the III-nitride semiconductor on the conductive area 22. The gate metal layer 110 comprises a gate connection line 112 and a first gate finger 114a extending from the gate connection line 112. The first gate finger 114a interposes between the source contact metal 120 and the first drain contact metal 130a and forms a Schottky contact with the III-nitride semiconductor 20 on the conductive area 22, and the gate connection line 112 is formed on the non-conductive area 24. The first gate finger 114a has a first terminal anchor 116a at an end thereof surrounding the source contact metal 120. The first gate finger 114a has a width, and the first terminal anchor 116a has an increased width w1a wider than the width of the first gate finger 114a.

In one embodiment, the source contact metal 120 has a width w2, and the first terminal anchor 116a surrounds the source contact metal in a range of 10% to 90% of the width w2 of the source contact metal 120. In a preferable embodiment, the first terminal anchor 116a surrounds the source contact metal in a range of 20% to 80% of the width w2 of the source contact metal 120. In another preferable embodiment, the first terminal anchor 116a surrounds the source contact metal in a range of 20% to 60% of the width w2 of the source contact metal 120.

In one embodiment, the width of the first terminal anchor 116a is ranging from 1 to 10 μm. In one embodiment, the width of the first terminal anchor 116a is uniform. In one embodiment, the first terminal anchor 116a is spaced from the source contact metal 120 in a range of 2 to 10 μm.

In one embodiment, the semiconductor structure further comprises a second drain contact metal 130b provided at another side of the source contact metal 120 and forms an ohmic contact with the III-nitride semiconductor on the conductive area 22, in which the gate metal layer 110 further comprises a second gate finger 114b extending from the gate connection line 112 and interposing between the source contact metal 120 and the second drain contact metal 130b and forming a Schottky contact with the III-nitride semiconductor 20 on the conductive area 22. The second gate finger 114b has a second terminal anchor 116b at an end thereof surrounding the source contact metal. The second gate finger 114b has a width, and the second terminal anchor 116b has an increased width w1b wider than the width of the second gate finger 114b.

In one embodiment, the first terminal anchor 116a and the second terminal anchor 116b are disconnected. The source contact metal has a width w2. The first terminal anchor 116a and the second terminal anchor 116b surround the source contact metal 120 in a range of 10% to 90% of the width w2 of the source contact metal 120. In a preferable embodiment, the first terminal anchor 116a and the second terminal anchor 116b surround the source contact metal in a range of 20% to 80% of the width w2 of the source contact metal 120. In another preferable embodiment, the first terminal anchor 116a and the second terminal anchor 116b surround the source contact metal in a range of 20% to 60% of the width w2 of the source contact metal 120.

In one embodiment, the width of the second terminal anchor 116b is ranging from 1 to 10 μm. In one embodiment, the width of the second terminal anchor 116b is uniform. In one embodiment, the second terminal anchor 116b is spaced from the source contact metal 120 in a range of 2 to 10 μm.

Figure 2:
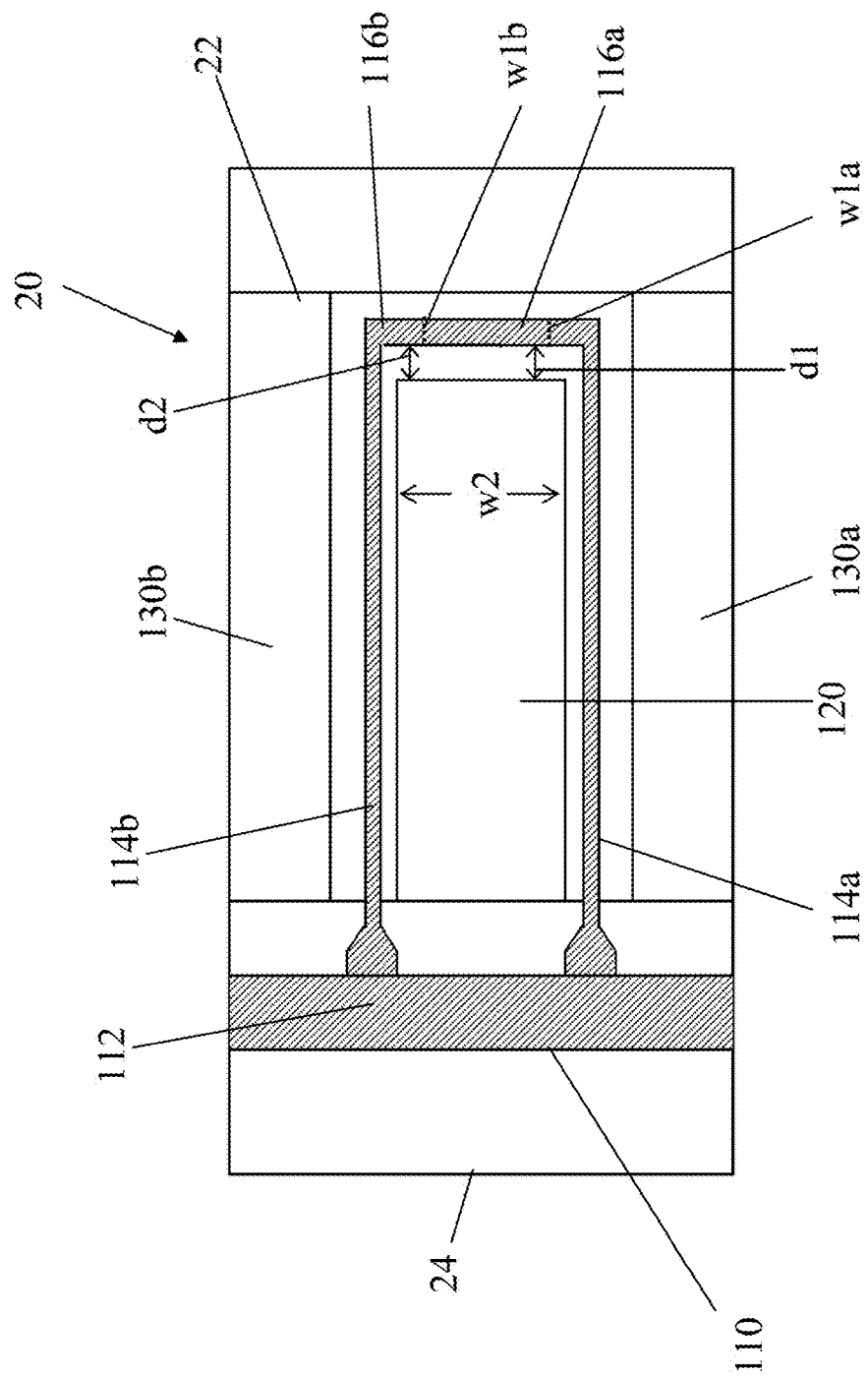
FIG. 2 is a schematic top view of another embodiment of the semiconductor structure provided by the present invention.

In one embodiment, as shown in FIG. 2, the first terminal anchor 116a and the second terminal anchor 116b are connected with each other. The connected first terminal anchor 116a and the second terminal anchor 116b have the same width ranging from 1 to 10 μm. In one embodiment, the connected first terminal anchor 116a and the second terminal anchor 116b are spaced from the source contact metal in a range of 2 to 10 μm.

In one embodiment of the fabrication process of the semiconductor structure, after forming ohmic contacts between the source contact metal 120 and the first/second drain contact metal 130a/130b and the III-nitride semiconductor 20, the conductive area 22 of the III-nitride semiconductor 20 is masked and an ion implantation process is performed on the III-nitride semiconductor 20. The crystal structure of the III-nitride semiconductor 20 in the uncovered area is damaged by the impinging ions and becomes insulated, thereby forming the non-conductive area 24. A gate contact area is formed on the conductive area 22 interposing between the source contact metal 120 and the first/second drain contact metal 130a/130b. A gate metal layer 110 comprising plural gate fingers and a gate connection line 112 is deposited on the top surface of the III-nitride semiconductor 20, in which the plural gate fingers are deposited on the conductive area 22 and form Schottky contacts with the III-nitride semiconductor 20, and the gate connection line 112 is deposited on the non-conductive area 24. In one embodiment, the gate connection line 112 is deposited on a dielectric layer on the non-conductive area 24. In another embodiment, the gate connection line 112 is in direct contact with the III-nitride semiconductor 20 on the non-conductive area 24.

In one embodiment, the III-nitride semiconductor 20 comprises a GaN layer. In another embodiment, the III-nitride semiconductor 20 further comprises an AlGaN, InAlN, AlN, or GaN layer.

In one embodiment, the semiconductor structure is a part of an FET. In one embodiment, the semiconductor structure is a part of an MMIC.

To sum up, the semiconductor structure provided by the present invention can indeed meet its anticipated objective to effectively improve the quality of the gate adhesion to the semiconductor and Schottky stability by including a wide and long gate anchor at the end of the gate finger, which may improve the stress and adhesion in the non-conductive area. Therefore, the Schottky stability of the device at high temperature and high voltage can be improved The description referred to in the drawings and stated above is only for the preferred embodiments of the present invention. Many equivalent local variations and modifications can still be made by those skilled at the field related with the present invention and do not depart from the spirit of the present invention, so they should be regarded to fall into the scope defined by the appended claims.

What is claimed is:

1. A semiconductor structure for improving the gate metal adhesion and the Schottky stability by engineering the stress in a III-nitride semiconductor, comprising:
   a III-nitride semiconductor having a top surface on which a conductive area and a non-conductive area are defined;
   a source contact metal forming an ohmic contact with the III-nitride semiconductor on the conductive area;
   a first drain contact metal provided at one side of the source contact metal and forming an ohmic contact with the III-nitride semiconductor on the conductive area; and
   a gate metal layer comprising a gate connection line and a first gate finger extending from the gate connection line, the first gate finger interposing between the source contact metal and the first drain contact metal and forming a Schottky contact with the III-nitride semiconductor on the conductive area, and the gate connection line formed on the non-conductive area, wherein the first gate finger has a first terminal anchor at an end thereof surrounding the source contact metal, and the first terminal anchor has an increased width.

2. The semiconductor structure according to claim 1, further comprising a second drain contact metal provided at another side of the source contact metal and forming an ohmic contact with the III-nitride semiconductor on the conductive area, wherein the gate metal layer further comprises a second gate finger extending from the gate connection line and interposing between the source contact metal and the second drain contact metal and forming a Schottky contact with the III-nitride semiconductor on the conductive area, and wherein the second gate finger has a second terminal anchor at an end thereof surrounding the source contact metal, and the second terminal anchor has an increased width.

3. The semiconductor structure according to claim 2, wherein the first terminal anchor and the second terminal anchor are disconnected.

4. The semiconductor structure according to claim 3, wherein the source contact metal has a width, and the first terminal anchor and the second terminal anchor surround the source contact metal in a range of 10% to 90% of the width of the source contact metal.

5. The semiconductor structure according to claim 2, wherein the first terminal anchor and the second terminal anchor are connected with each other.

6. The semiconductor structure according to claim 2, wherein the width of the second terminal anchor is ranging from 1 to 10 µm.

7. The semiconductor structure according to claim 2, wherein the second terminal anchor is spaced from the source contact metal in a range of 2 to 10 µm.

8. The semiconductor structure according to claim 1, wherein the source contact metal has a width, and the first terminal anchor surrounds the source contact metal in a range of 10% to 90% of the width of the source contact metal.

9. The semiconductor structure according to claim 1, wherein the width of the first terminal anchor is ranging from 1 to 10 µm.

10. The semiconductor structure according to claim 1, wherein the first terminal anchor is spaced from the source contact metal in a range of 2 to 10 µm.

11. The semiconductor structure according to claim 1, wherein the gate connection line is in direct contact with the III-nitride semiconductor on the non-conductive area.

12. The semiconductor structure according to claim 1, wherein the semiconductor structure is a part of an FET.

13. The semiconductor structure according to claim 1, wherein the semiconductor structure is a part of an MMIC.

* * * * *